United States Patent
Kuo (10) Patent No.: US 7,655,970 B2
(45) Date of Patent: Feb. 2, 2010

(54) SINGLE POLY NON-VOLATILE MEMORY DEVICE WITH INVERSION DIFFUSION REGIONS AND METHODS FOR OPERATING THE SAME

(75) Inventor: Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 425 days.

(21) Appl. No.: 11/359,028

(22) Filed: Feb. 22, 2006

(65) Prior Publication Data

US 2007/0194366 A1    Aug. 23, 2007

(51) Int. Cl.
*H01L 29/94* (2006.01)
(52) U.S. Cl. ............................ 257/319; 257/E29.3
(58) Field of Classification Search .............. 257/319, 257/E29.3
See application file for complete search history.

(56) References Cited

U.S. PATENT DOCUMENTS 6,917,070 B2    7/2005    Hung et al.

2003/0203575 A1*   10/2003   Hung et al. ............... 438/266
2005/0145923 A1*    7/2005   Chen et al. ............... 257/315

OTHER PUBLICATIONS

Y. Sasago, et al.. 90-nm-Node Multi-level AG-AND Type flash Memory with Cell Size of True 2 F2/bit and Programming Throughout of 10 MB/s, IEEE, 2003.
Daniel C. Guterman, et al., An Electrically Nonvolatile Memory Cell Using a Floating-Gate Structure, IEEE 1979.

* cited by examiner

*Primary Examiner*—Bradley K Smith
*Assistant Examiner*—Amar Movva
(74) *Attorney, Agent, or Firm*—Baker & McKenzie LLP (57) ABSTRACT

A non-volatile memory device comprises a substrate with the dielectric layer formed thereon. A control gate and a floating gate are then formed next to each other on top of the dielectric layer separated by a gap. Accordingly, a non-volatile memory device can be constructed using a single poly process that is compatible with conventional CMOS processes. In addition, assist gates are formed on the dielectric layer next to the control gate and floating gate respectively.

14 Claims, 10 Drawing Sheets

SINGLE POLY NON-VOLATILE MEMORY DEVICE WITH INVERSION DIFFUSION REGIONS AND METHODS FOR OPERATING THE SAME

BACKGROUND

1. Field of the Invention

The embodiments described herein are directed to non-volatile memory devices, and more particularly to a non-volatile memory device comprising a single polysilicon gate layer that is compatible with CMOS processing techniques.

2. Background of the Invention

Many non-volatile semiconductor memories are based on the well known MOS-type structure. In other words, they comprise a gate structure separated from a substrate by a dielectric layer. Diffusion regions are implanted in the substrate under the corners of the gate structure. When the appropriate voltages are applied to the diffusion regions and the control gate, a channel can be created in the upper layers of the substrate between the diffusion regions and under the gate structure. Carriers, e.g., electrons, can travel the channel between the diffusion regions.

If a sufficient field component is present in the direction of the gate structure, the carriers, e.g., electrons, can be attracted to the gate structure. If the electrons have enough energy to overcome the barrier height of the dielectric layer, then these carriers can be injected through the dielectric layer.

Figure 1:
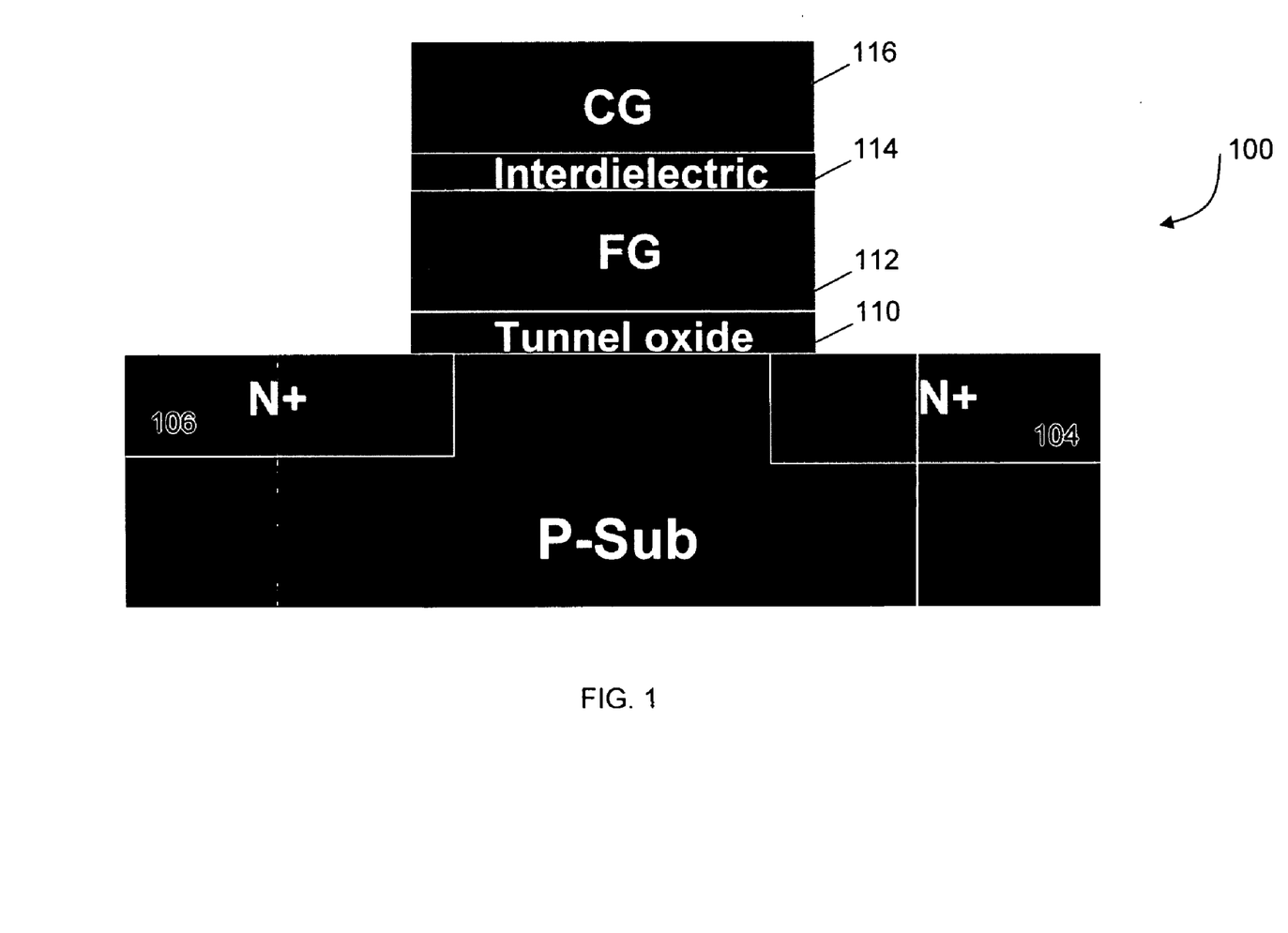
FIG. 1 is a diagram illustrating a conventional floating gate memory device.

For example, FIG. 1 is a diagram illustrating a conventional floating gate memory device 100. It will be understood that such a floating gate device can be the basic memory structure of a conventional flash memory device. Floating gate device 100 comprises of substrate 102 into which diffusion region 104 and 106 have been implanted. In the example of FIG. 1, device 100 is an NMOS device, meaning that substrate 102 is a P-type substrate while diffusion regions 104 and 106 are N+-type diffusion regions. It will be understood that certain memory devices can also make use of PMOS structures in which substrate 102 is an N-type substrate and diffusion regions 104 and 106 are P+-type diffusion regions.

A dielectric layer 110 is then formed over the substrate between diffusion regions 104 and 106. This dielectric layer is often a silicon dioxide dielectric layer and can be referred to as the tunnel oxide layer. A floating gate 112 is formed on top of dielectric layer 110. Floating gate 112 is typically formed from a polysilicon layer that is deposited on top of substrate 102 and etched to the appropriate dimensions. An inter-dielectric layer 114 is then formed over floating gate 112, and a control gate 116 is then formed on inter-dielectric layer 114. As with floating gate 112, control gate 116 is typically formed from a polysilicon layer that is etched to the appropriate dimensions.

When the appropriate voltages are applied to control gate 116 and diffusion regions 104 and 106, a channel can be formed in channel region 108 of substrate 102. The voltage applied to control gate 116 will couple with floating gate 112 to create the field component necessary to attract carriers in channel region 108 to floating gate 112. It will be understood, that the coupling between control gate 116 and floating gate 112 is dependent on the voltage applied to control gate 116 as well as the dimensions associated with control gate 116, inter-dielectric layer 114, and floating gate 112.

It will further be understood that density and cost are important driving factors in non-volatile semiconductor memory technology. The ever-expanding uses for non-volatile semiconductor memories require such memories to be mass-producible at low cost. Further, the requirements of new applications for non-volatile semiconductor memories require increased capacity, and a decreased footprint.

Device 100 of FIG. 1 presents several problems in this regard. First, because both floating gate 112 and control gate 116 are formed from polysilicon layers, device 100 is fabricated using what is termed a double poly process. This makes fabrication of device 100 incompatible with conventional CMOS techniques, which are single poly processes. As a result, special processes are required in order to fabricate device 100. Second, the need for diffusion regions 104 and 106, and for sufficient coupling between control gate 116 and floating gate 112, limits the minimum dimensions that can be achieved for device 100. For example, a certain active area is required in order to provide proper operation.

Figure 2:
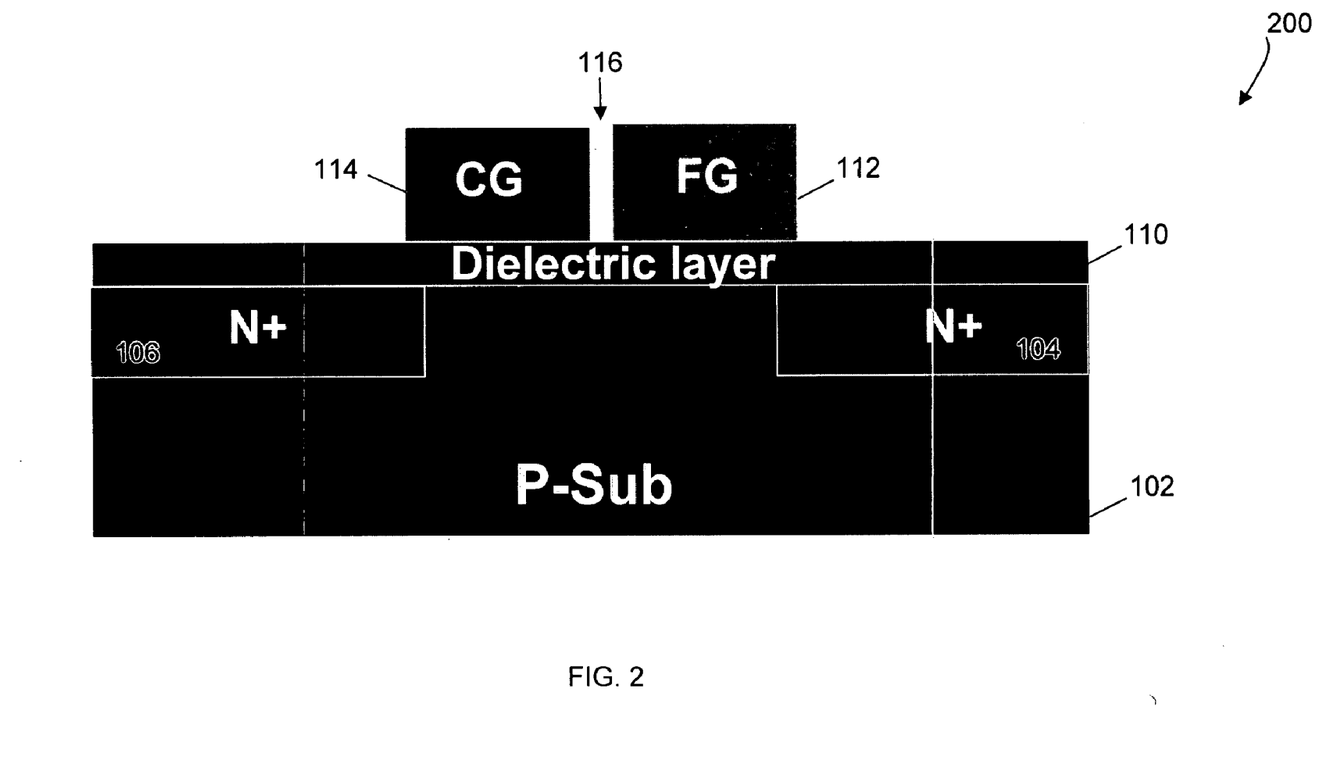
FIG. 2 is a diagram illustrating a conventional floating gate memory device that is compatible with the single poly fabrication process.

FIG. 2 is a diagram illustrating a conventional floating gate device 200 that overcomes some of the limitations associated with device 100 of FIG. 1. As can be seen, device 200 comprises a substrate 102 and diffusion regions 104 and 106 implanted therein. Floating gate 112 is then formed over dielectric layer 110, which is formed over the substrate 102. In device 2000, however, control gate 114 is also formed on dielectric 110 separated from floating gate 112 by a gap 116. Voltages applied to control gate 114 can still couple with floating gate 112 to thereby induce carriers in channel region 108 to tunnel through dielectric layer 110 onto floating gate 112.

Advantageously, floating gate 112 and control gate 114 can be formed using a single poly process, which can make fabrication of device 200 compatible with conventional CMOS techniques; however, device 200 does not overcome the minimum dimension restrictions associated with device 100.

SUMMARY

A non-volatile memory device comprises a substrate with the dielectric layer formed thereon. A control gate and a floating gate are then formed next to each other on top of the dielectric layer separated by a gap. Accordingly, a non-volatile memory device can be constructed using a single poly process that is compatible with conventional CMOS processes. In addition, assist gates are formed on the dielectric layer next to the control gate and floating gate respectively.

In one aspect the assist gates are used to form inversion diffusion layers in the substrate. By using the assist gates to form inversion diffusion layers, the overall size of the device can be reduced, which can improve device density.

In another aspect, one of the assist gates can be used to enhance coupling with the floating gate to turn on a channel below the floating gate. By using the assist gate to enhance coupling with the floating gate, lower voltages can be used and smaller active areas are required.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The embodiments described below are directed to a non-volatile memory device comprising a substrate with a dielectric layer formed thereon. A floating gate is then formed on the dielectric layer over the substrate and a control gate is then disposed next to the floating gate on the dielectric layer. In addition, assist gates are formed on the dielectric layer next to the control gate and floating gate, respectively. The assist gates can be used to form inversion diffusion regions in the substrate that can then produce a channel region to support carriers that can be used to program the device. One of the assist gates can then be used to enhance coupling to the floating gate. Voltages applied to the control gate and the assist gate can couple with the floating gate and provide the field necessary to cause some of the carriers in the channel region to penetrate the dielectric layer into the floating gate.

Figure 3A:
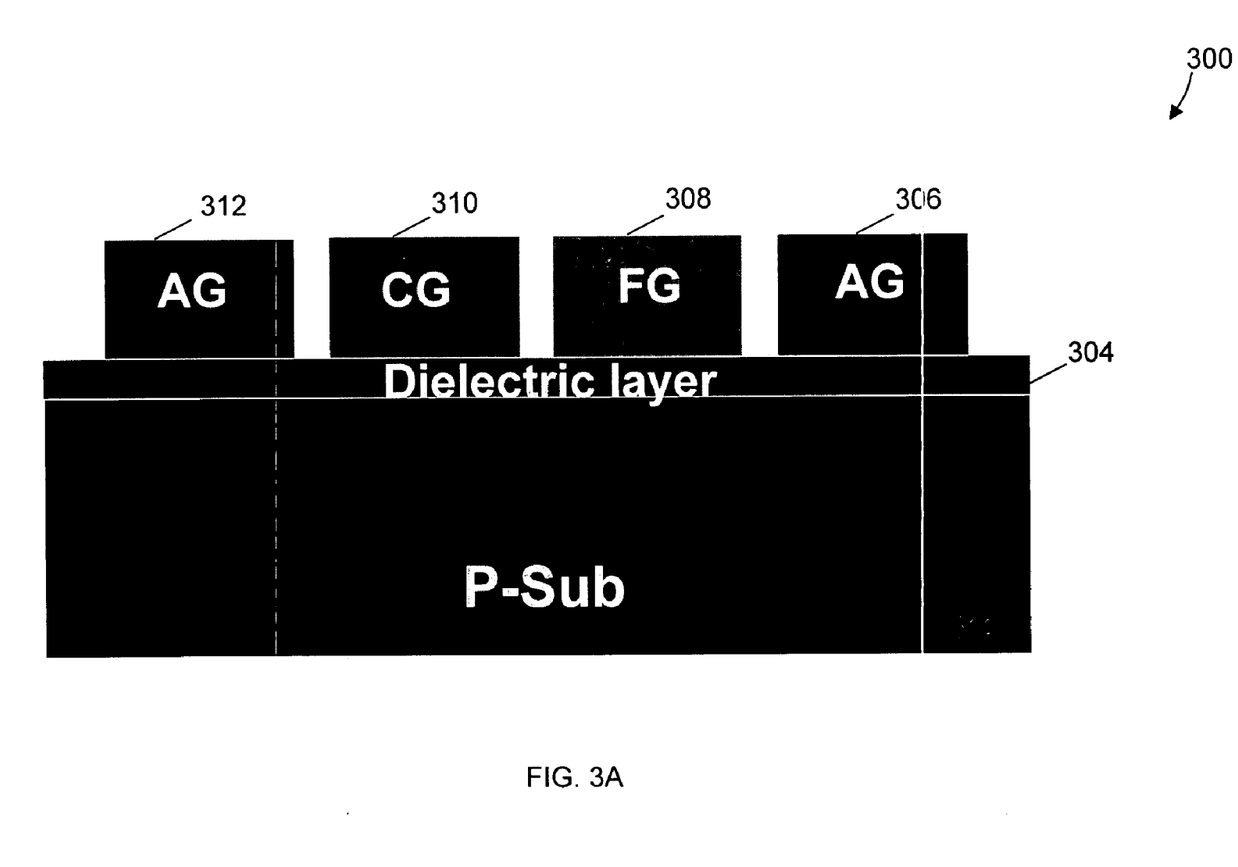
FIG. 3A is a diagram illustrating an NMOS non-volatile memory device configured in accordance with one embodiment.

FIG. 3A is a diagram illustrating an example non-volatile memory device 300 configured in accordance with one embodiment. Device 300 is an NMOS device. Thus, device 300 comprises a P-type substrate 302 and a dielectric layer 304 formed thereon. For example, dielectric layer 304 can be a silicon dioxide dielectric layer. Assist gates 306 and 312 are then formed on the dielectric layer along with floating gate 308 and a control gate 310. Importantly, assist gates 306 and 312, as well as floating gates 308 and control gate 310, can be formed using a single poly fabrication process.

By applying the proper voltages to assist gates 306 and 312, inversion diffusion regions can be formed under dielectric layer 304 in substrate 302. In the example of FIG. 3A, the inversion diffusion regions are N+ diffusion regions.

Figure 3B:
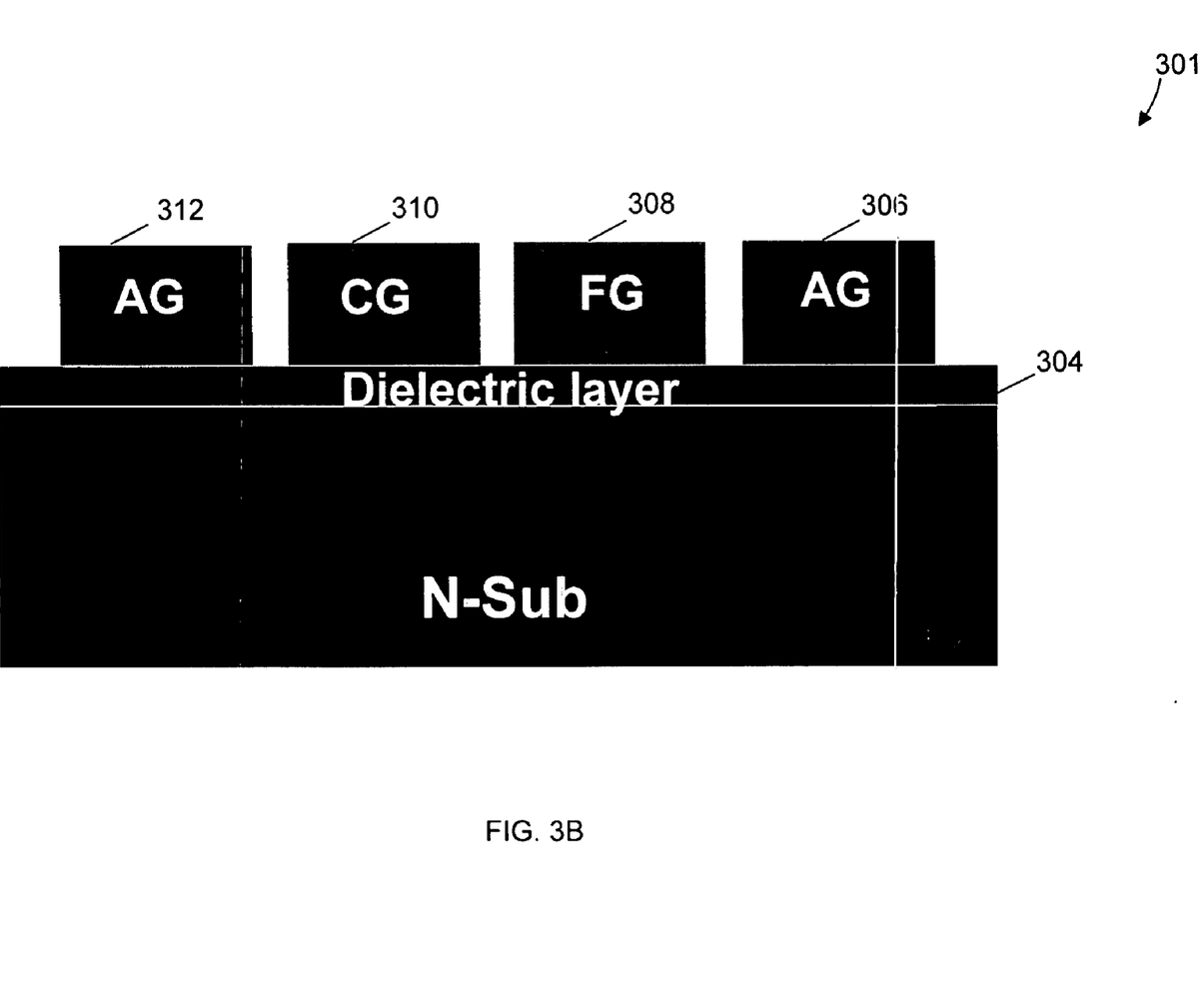
FIG. 3B is a diagram illustrating a PMOS non-volatile memory device configured in accordance with another embodiment.

FIG. 3B is a diagram illustrating an example PMOS non-volatile memory device configured in accordance with one embodiment. Accordingly, device 301 comprises an N-type silicon substrate 302 with a dielectric layer 304 formed thereon. Again, dielectric layer 304 can be a silicon dioxide layer. Assist gates 306 and 312 as well as floating gate 308 and control gate 310 can then be formed on dielectric layer 304. Again, all of gates 306, 308, 310 and 312 can be formed using a single poly fabrication process. Further, by applying the appropriate voltages to assist gates 306 and 312 inversion diffusion regions can be formed under dielectric layer 304 and substrate 302. Here, the inversion diffusion regions are P+-type inversion diffusion regions.

Figure 4:
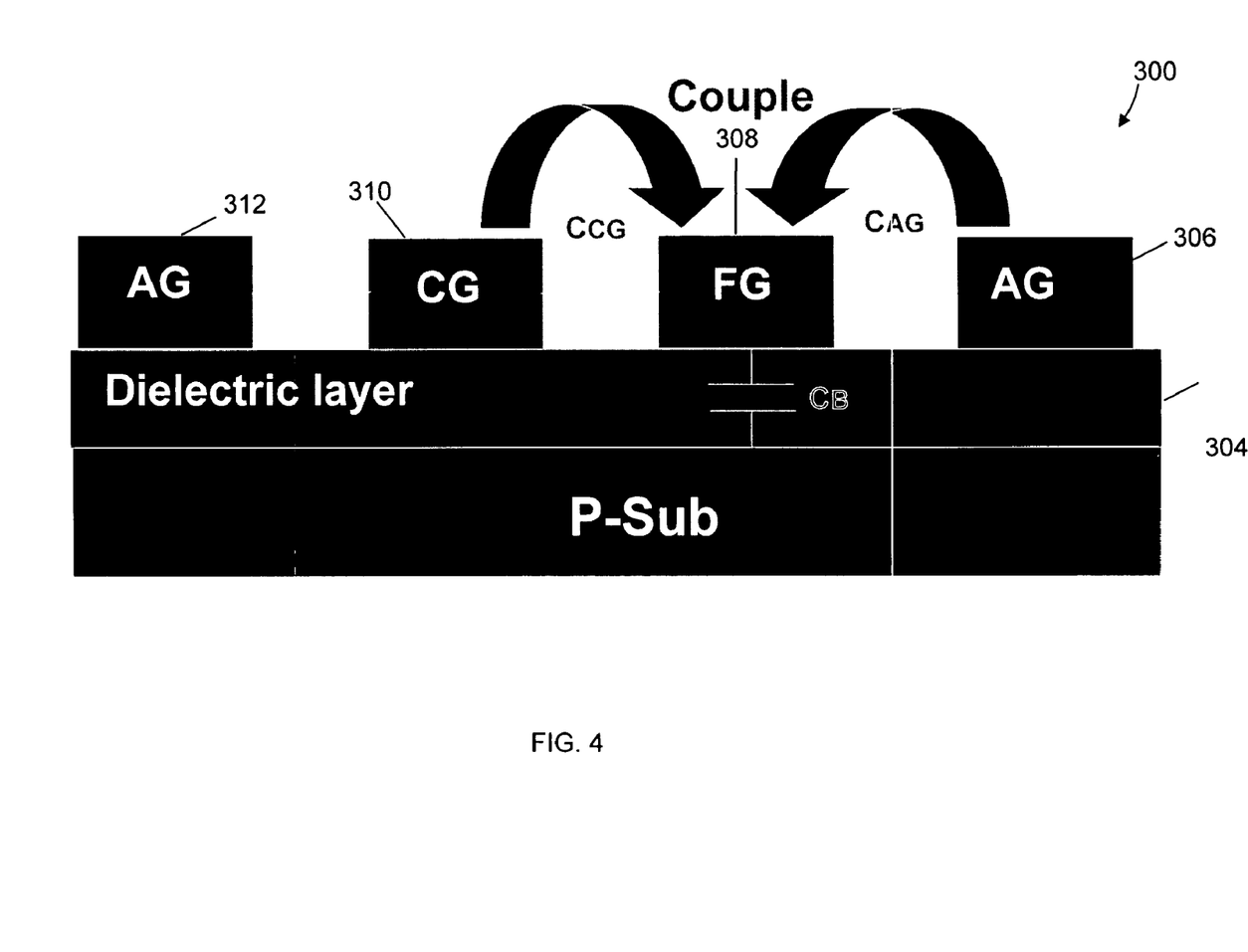
FIG. 4 is a diagram illustrating the coupling between a control gate and an assist gate with a floating gate for the device of FIG. 3A.

As mentioned, control gate 310 and assist gate 306 can couple with floating gate 308 in order to provide the field necessary to induce carriers in substrate 302 to penetrate dielectric layer 304 into floating gate 308. This coupling can be illustrated with the aid of FIGS. 4 and 5. FIG. 4 is a diagram illustrating the capacitance formed between the various gates and layers of device 300. As can be seen, when voltages are applied to assist gate 306 and control gate 310 these voltages can be coupled to floating gate 308 via a control gate capacitance ($C_{CG}$) and assist gate capacitance ($C_{AG}$). Floating gate 308 is then coupled with substrate 302 via bulk capacitance ($C_B$). It is the capacitive coupling mechanisms that create the field necessary to cause carriers in substrate 302 to penetrate dielectric layer 304 into floating gate 308.

Figure 5:
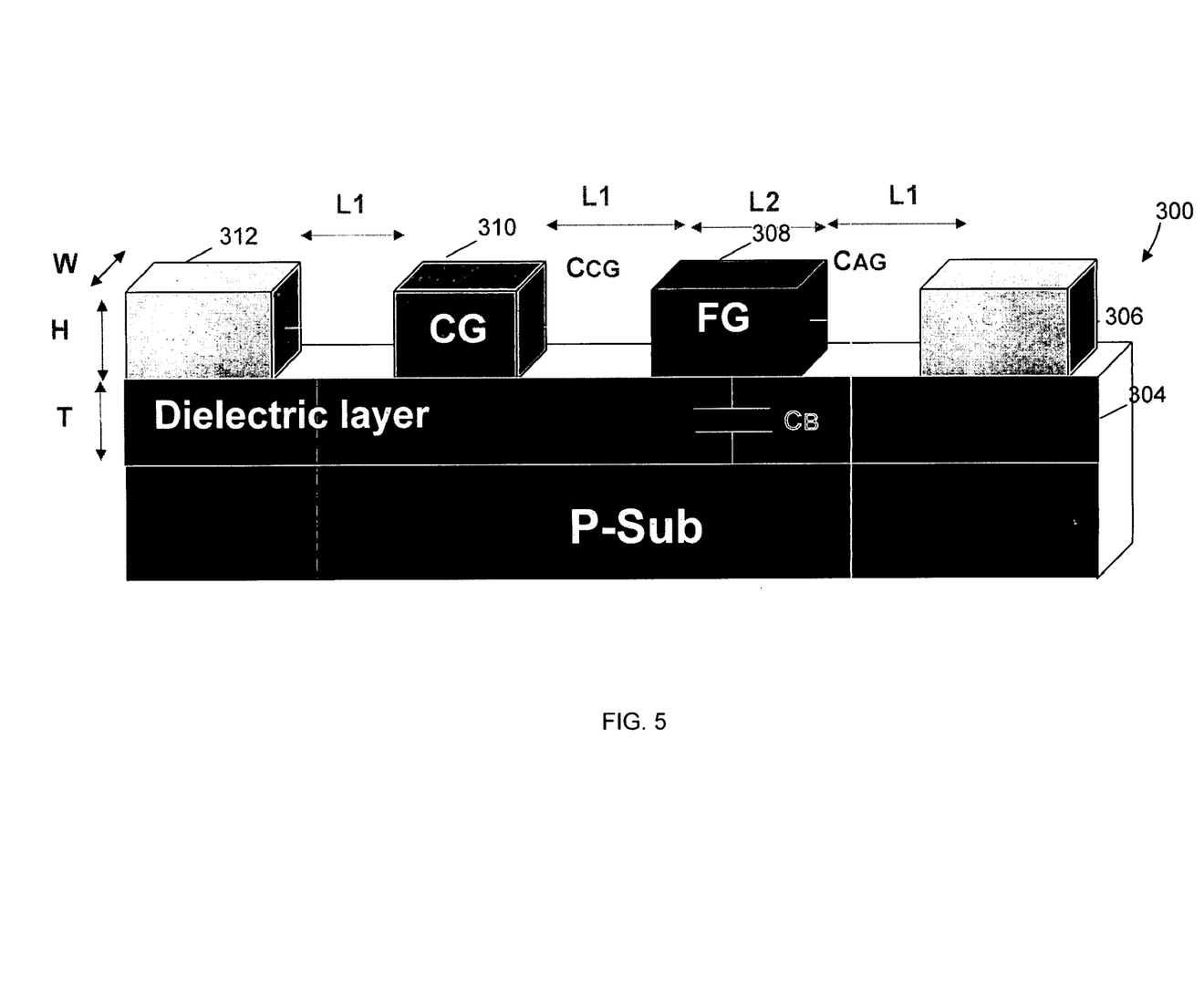
FIG. 5 is a diagram illustrating the dimensions associated with the gates and layers of the device in FIG. 3A.

FIG. 5 is a diagram illustrating example dimensions associated with device 300 in accordance with one particular implementation. These dimensions can be used to illustrate the coupling that can be produced for device 300. First, the control gate capacitance ($C_{CG}$), assist gate capacitance ($A_{CG}$), and bulk capacitance ($C_B$) are given by the following equations:

$$C_{CG} = \epsilon(H*W)/L1 \quad (1)$$

$$C_{AG} = \epsilon(H*W)/L1 \quad (2)$$

$$C_B = \epsilon(L2*W)/T \quad (3)$$

Where, $\epsilon$=dielectric constant; and
  W=the width of the gate into the page.
  H=the height of the gate
  L1=the spacer length between the gates.
  L2=the length of floating gate
  T=the thickness of dielectric layer Thus, the control gate capacitance ($C_{CG}$) is equal to $\epsilon$ multiplied by the height of control gate 310, multiplied by the width of control gate 310, and then divided by the spacing between control gate 310 and floating gate 308. The assist gate capacitance ($C_{AG}$) is equal to $\epsilon$ multiplied by the height of assist gate 306, multiplied by the width of assist gate 306, and then divided by the spacing between assist gate 306 and floating gate 308. The bulk capacitance ($C_B$) is equal to $\epsilon$ multiplied by the length of floating gate 308, multiplied by the width of floating gate 308, and then divided by the height of dielectric layer 304.

The total capacitance is then given by the following equation:

$$C_{TOT} = C_{CG} + C_{AG} + C_B \quad (4)$$

The coupling ratio between control gate 310 and floating gate 308 is then given by the following equation;

$$\alpha_{CG} = C_{CG}/C_{TOT} \quad (5)$$

Similarly, the coupling ratio between assist gate 306 and floating gate 308 is then given by the following equation;

$$\alpha_{AG} = C_{AG}/C_{TOT} \quad (6)$$

Accordingly, the voltage on floating gate 308 can be given by the following equation;

$$V_{FG} = (V_{CG}*\alpha_{CG}) + (V_{AG}*\alpha_{AG}) \quad (7)$$

For example, in one embodiment a non-volatile memory device configured in accordance with the systems and methods described herein can comprise the following dimensions;
  H=1000 Å;
  L1=200;
  L2=600; and
  T=100 Å.

Thus, the total capacitance is then given by equation (4):

$$C_{TOT} = C_{CG} + C_{AG} + C_B \epsilon 16W$$

The coupling between control gate 310 and floating gate 308 is then given by equation (5);

$$\alpha_{CG} = C_{CG}/C_{TOT} = \epsilon 5W/\epsilon 16W = 5/16$$

The coupling between assist gate 306 and floating gate 308 is then given equation (6);

$$\alpha_{AG} = C_{CG}/C_{TOT} = \epsilon 5W/\epsilon 16W = 5/16$$

The voltage on floating gate 308 can be given by equation (7):

$$V_{FG} = (V_{CG} * \alpha_{CG}) + (V_{AG} * \alpha_{AG})$$
$$= (V_{CG} + V_{AG}) * 5/16$$

It will be understood that the dimensions described above can vary depending on the requirements of a specific invention; however, it will be clear that sufficient coupling must be achieved regardless of the dimensions used. Accordingly, the actual dimension for a given implementation must be sufficient to provide the required coupling.

In certain other embodiments, for example, the dimensions described above can have values in the following approximate ranges:

H=800-1500 Å;
L1=160-300 Å;
L2=400-800 Å; and
T=50-250 Å.

Further, it will be understood that while the spacing between the gates was uniform in the examples described above, other embodiments can have non-uniform spacing.

Since the floating gate voltage ($V_{FG}$) is based on the combination of the control gate voltage ($V_{CG}$) and the assist gate voltage ($V_{AG}$), lower voltages can be applied to control gate 310 and assist gate 306 in order to produce sufficient voltage on floating gate 308. As a result, the overall power consumption can be reduced, which can improve device lifetimes and increase densities. Further, smaller dimensions can be used in order to produce sufficient coupling, which can lead to lower active areas and lower overall device dimensions. This can further improve densities and lower cost. Further, as mentioned, devices 300 and 301 do not include diffusion regions, which can further reduce device size and increase densities.

Figure 6:
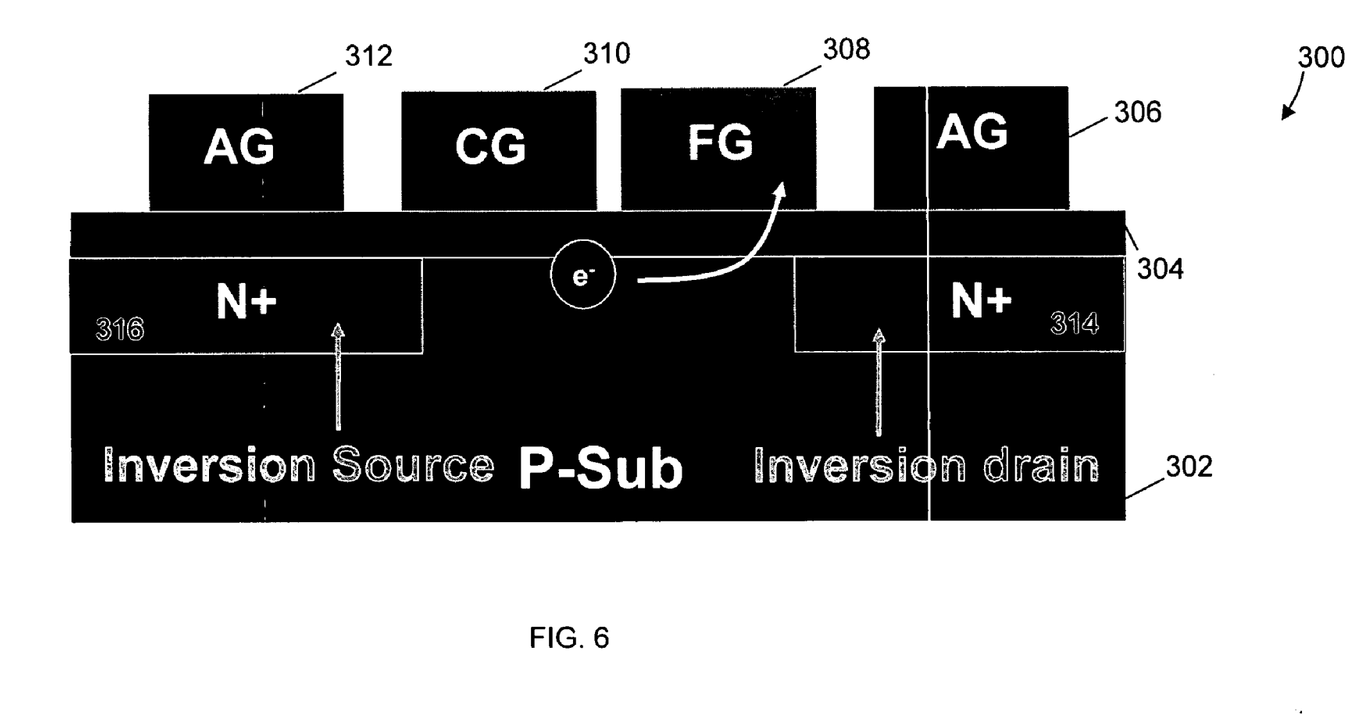
FIG. 6 is a diagram illustrating an example of program operation for the device of 3A in accordance with one embodiment.

Inversion diffusion regions can be formed in the device in order to produce the carriers necessary to program and erase floating gate 308. This can be illustrated with the aid of FIGS. 6-8. FIG. 6 is a diagram illustrating an example program operation for device 300 in accordance with one embodiment. By applying the proper voltages to assist gates 306 and 312, N+ diffusion regions 314 and 316 can be formed in substrate 302. Voltages can then be applied to these diffusion regions in order to create a large lateral electric field between diffusion regions 314 and 316. The voltage of control gate and the voltage coupled with floating gate 308 can produce a channel in channel region 318 and the large lateral electric field can induce carrier 602, i.e., hot electrons, to flow in the channel from diffusion region 316 toward diffusion region 314 and inject through dielectric layer 304 into floating gate 308.

It will be understood, that carrier 602 must have sufficient energy to overcome the barrier height of dielectric layer 304. For example, if dielectric layer 304 is a silicon dioxide dielectric layer, then carrier 602 must have energies exceeding 3.2 eV in order to overcome the barrier height of the silicon dioxide layer 304.

Thus, high voltages must be applied to assist gate 306 and control gate 310 in order to couple voltage to floating gate 308. The voltage of control gate and floating gate can produce a channel in channel region 318. In the example of FIG. 6, a high voltage of approximately 10V is applied to control gate 310, while high voltage of approximately 8V is applied to assist gate 306. Further, a high voltage of approximately 5V is applied to diffusion region 314, while diffusion region 316 is tied to approximately 0V.

It will be understood that the voltages illustrated are by way of example only and that the actual voltages will depend on the requirements of the specific implementation. For example, in certain embodiments, the voltage applied to control gate 310 can be in the approximate range of 8-12 V, The voltage applied to assist gate 306 can be in the approximate range of 6-9V, and the voltage applied to diffusion region 314 can be in the approximate range of 4-6V.

The voltages applied to diffusion regions 314 and 316 are provided in order to produce the large lateral electric field necessary to induce carrier 602 to flow in channel region 318 and provide carrier 602 with enough energy to inject into layer 304. The voltage applied to assist gate 306 is also needed to produce inversion diffusion region 314.

A high voltage is also applied to assist gate 312 in order to produce inversion diffusion region 316. Again, in the example of FIG. 6, high voltages in the approximate range of 6-9V, e.g., approximately 8V, are applied to assist gates 306 and 312.

It will be understood, however, that the voltages illustrated in FIG. 6 are by way of example only and that the actual voltages used will depend on the requirements of a specific implementation.

Figure 7:
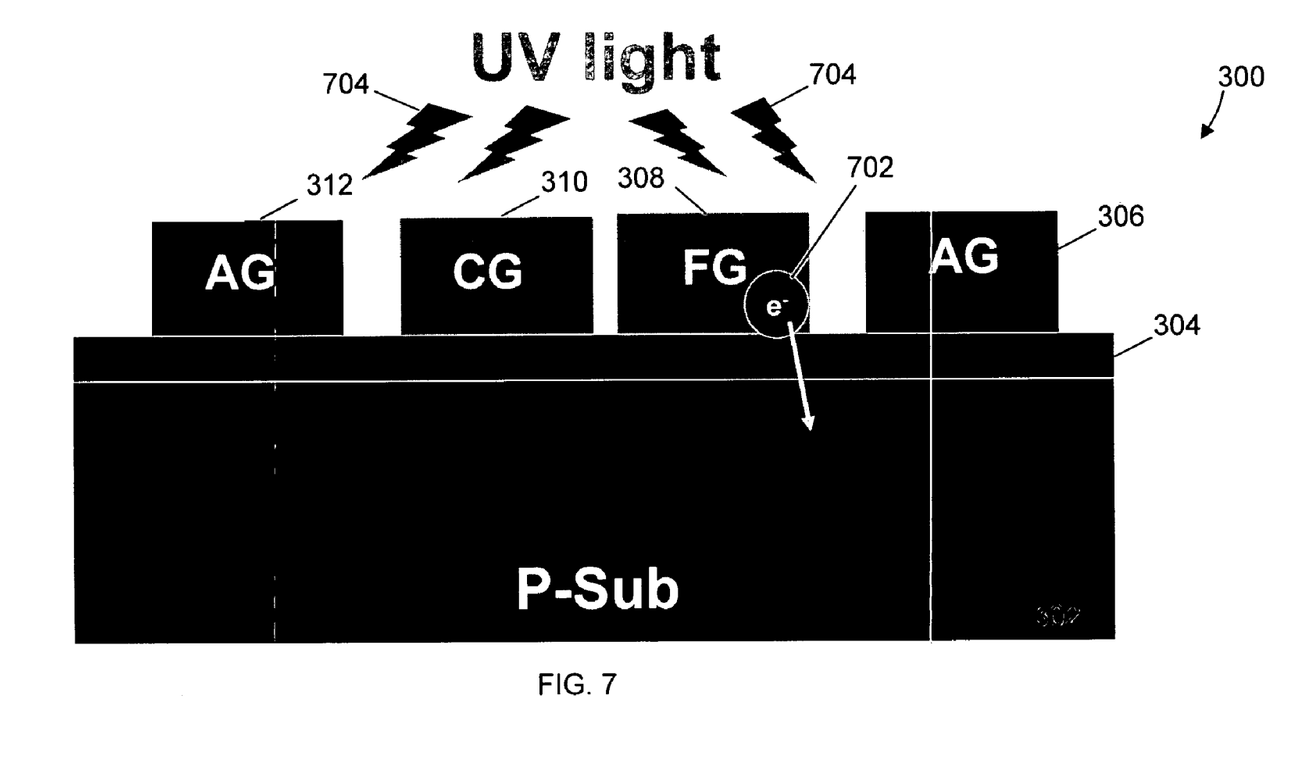
FIG. 7 is a diagram illustrating an example of an erase operation for the device of FIG. 3A in accordance with one embodiment.

FIG. 7 is a diagram illustrating an example erase operation for device 300 in accordance with one embodiment. In the example of FIG. 7, ultraviolet (UV) radiation 704 is incident on device 300. The energy from radiation 704 will provide electron 702 with sufficient energy to penetrate dielectric layer 304 and escape back into substrate 302.

Figure 8:
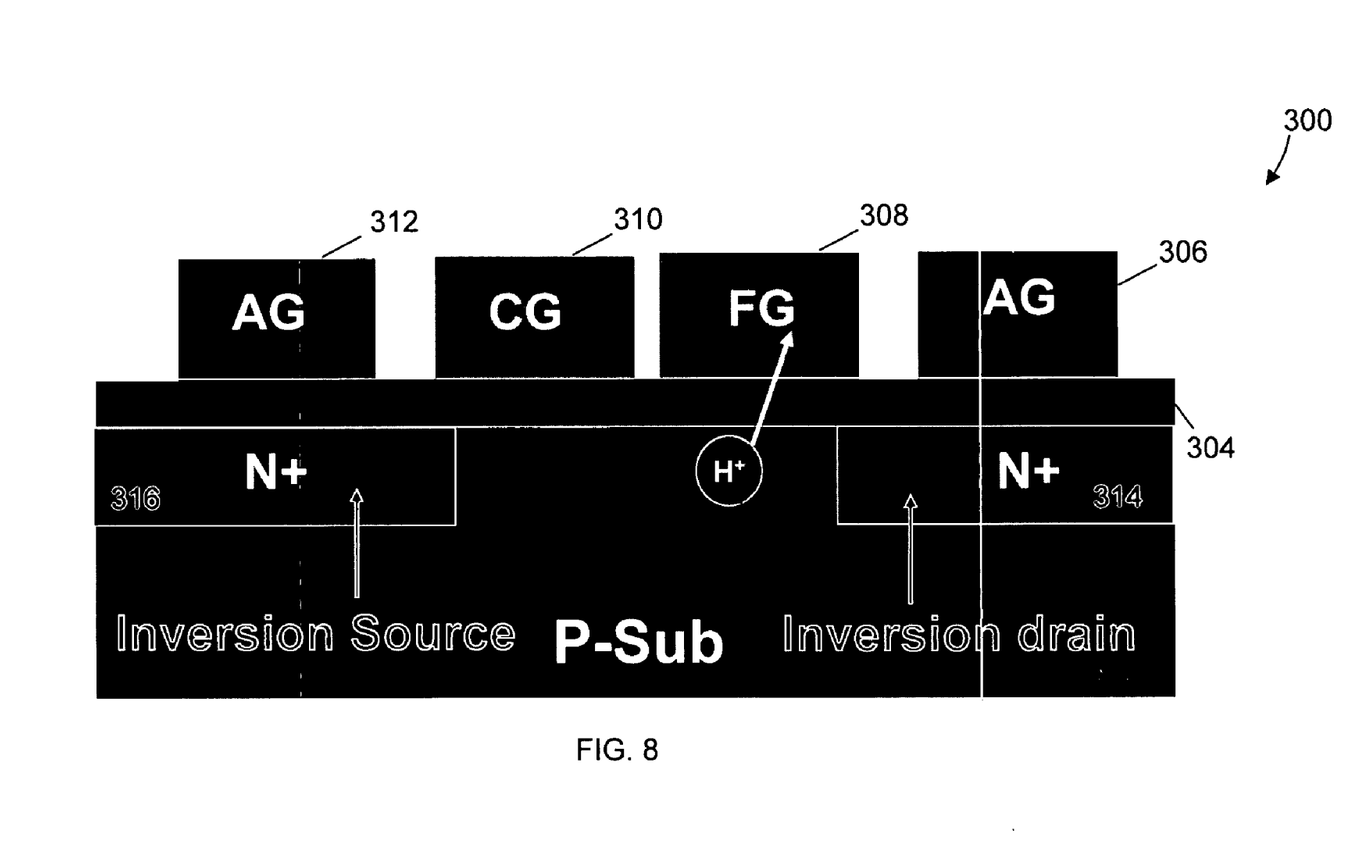
FIG. 8 is a diagram illustrating another example of an erase operation for the device of FIG. 3A in accordance with one embodiment.

In FIG. 8, avalanche hot carrier injection is used to erase device 300 in accordance with another embodiment. Thus, in the example of FIG. 8, voltages are applied to diffusion region 314 and 316 in order to create a large lateral electric field that will cause carriers 802, in this case holes 802, to inject into floating gate 308. Further, high voltages must be applied to assist gates 306 and 312 in order to create inversion diffusion regions 314 and 316.

In the example in FIG. 8, a high voltage in the approximate range of 5-8V, e.g., approximately 6.5V, is applied to diffusion region 314 while a low voltage of approximately 0V is applied to inversion diffusion region 316. These voltages produce the high lateral electric field needed to induce holes 802 into channel region 318. High voltages in the approximate range of 6-9V, e.g., approximately 8V, are applied to assist gates 306 and 312 in order to create inversion diffusion regions 314 and 316, and for coupling between assist gate 306 and floating gate 308. A high voltage in the approximate range of 3-5V, e.g., approximately 4V, is applied to control gate 310.

It will be understood, however, that the voltages illustrated in FIG. 8 are by way of example only and that the actual voltages used will depend on the requirements of a specific implementation.

Figure 9:
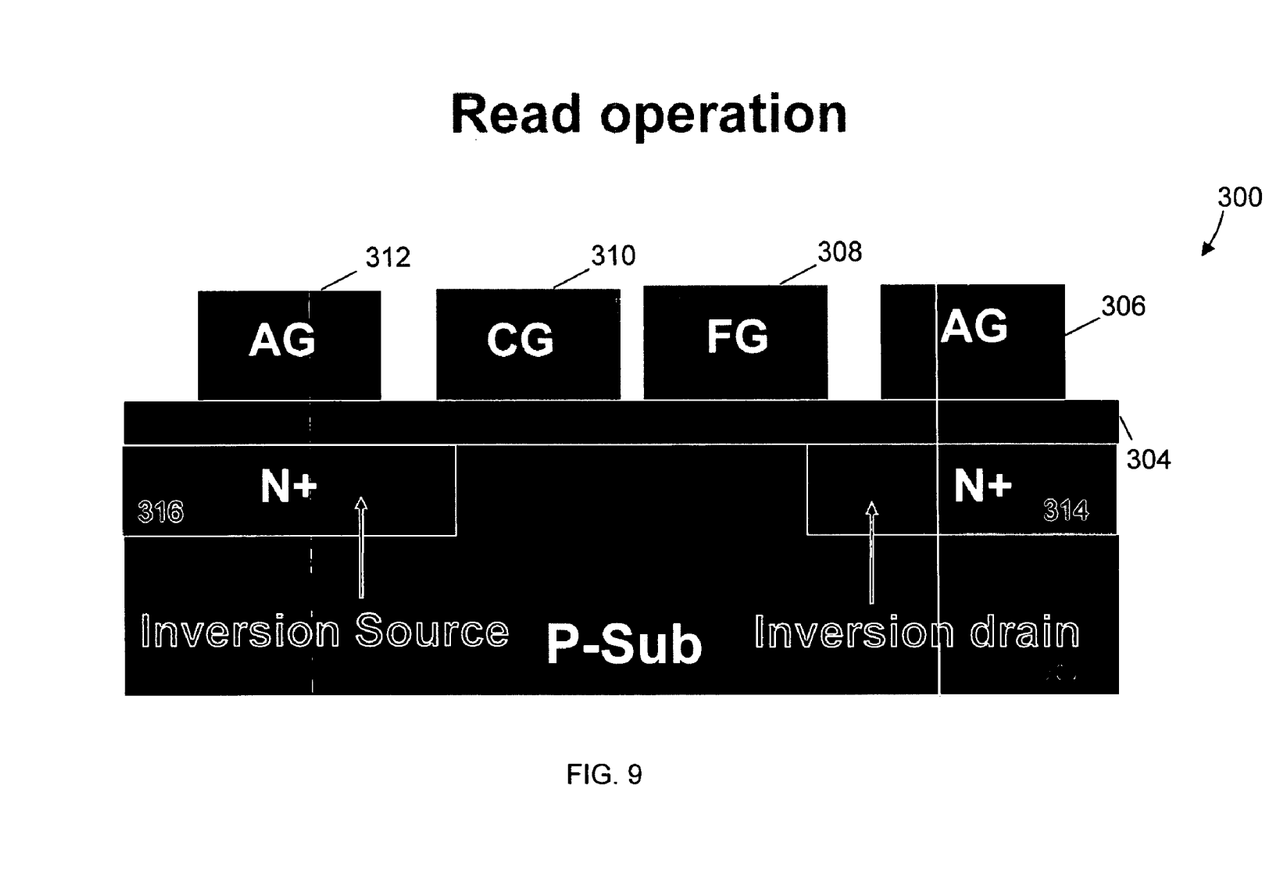
FIG. 9 is a diagram illustrating an example of read operation for the device of FIG. 3A in accordance with one embodiment.

FIG. 9 is a diagram illustrating an example read operation for device 300 in accordance with one embodiment. First, high voltages must be applied to assist gates 306 and 312 in order to create inversion diffusion regions 314 and 316. A high voltage can then be applied to control gate 310. A high voltage can also be applied to inversion diffusion region 314, while a low voltage is applied to inversion diffusion region 316.

In the example of FIG. 9, high voltages in the approximate range of 6-9V, e.g., approximately 8V, are applied to assist gates 306 and 312. A high voltage in the approximate range of 4-6V, e.g., approximately 5V, is applied to control gate 310, while a high voltage in the approximate range of 1-1.6V, e.g., approximately 1V, is applied to inversion diffusion region 314. Inversion diffusion region 316 can be tied to a low voltage of approximately 0V.

Again, the voltages illustrated in FIG. 9 are by way of example only and it will be understood that the actual voltages used would depend on the requirements of the specific implementation.

Accordingly, the non-volatile memory devices described above, and the methods associated therewith, can provide higher densities, lower cost, and decrease power consumption. Further, the devices described above are compatible with conventional single poly fabrication processes, which can further reduce costs and increase throughput.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory device, comprising:
   a substrate;
   a dielectric layer formed on the substrate;
   a floating gate formed on the dielectric layer;
   a control gate formed on the dielectric layer near the floating gate, both the floating gate and the control gate being positioned over a substantially uniform channel region of the substrate;
   a first assist gate formed on the dielectric layer near the floating gate; and
   a second assist gate formed on the dielectric layer near the control gate,
   wherein the floating and control gates and the first and second assist gates are each formed along a common plane on the dielectric layer such that lowermost surfaces of each of the floating and control gates and the first and second assist gates are substantially coplanar.

2. The non-volatile memory device of claim 1, wherein the first and second assist gates are configured to form inversion diffusion regions in the substrate when a sufficient voltage is supplied to the first and second assist gates.

3. The non-volatile memory device of claim 1, wherein the substrate is a p-type substrate.

4. The non-volatile memory device of claim 1, wherein the substrate is a n-type substrate.

5. The non-volatile memory device of claim 1, wherein the floating gate, control gate, and first and second assist gates are fabricated using a single poly processes.

6. The non-volatile memory device of claim 1, wherein the control gate and the first assist gate are configured to couple voltages applied to the control gate and first assist gate with the floating gate.

7. The non-volatile memory device of claim 6, wherein the capacitance between the control gate and the floating gate is equal to $\epsilon$ multiplied by the height of control gate, multiplied by the width of control gate, and then divided by the spacing between control gate and floating gate.

8. The non-volatile memory device of claim 7, wherein the height of the control gate is approximately 800~1500 Å.

9. The non-volatile memory device of claim 7, wherein the spacing between the control gate and the floating gate is approximately 160~300 Å.

10. The non-volatile memory device of claim 6, wherein the capacitance between the assist gate and the floating gate is $\epsilon$ multiplied by the height of assist gate, multiplied by the width of assist gate, and then divided by the spacing between assist gate and floating gate.

11. The non-volatile memory device of claim 10, wherein the height of the assist gate is approximately 800~1500 Å.

12. The non-volatile memory device of claim 10, wherein the space between the assist gate and the floating gate is approximately 160~300 Å.

13. The non-volatile memory device of claim 1, wherein each of the floating and control gates and the first and second assist gates are formed directly on the dielectric layer.

14. The non-volatile memory device of claim 1, wherein uppermost surfaces of each of the floating and control gates and the first and second assist gates are substantially coplanar.

* * * * *

UNITED STATES PATENT AND TRADEMARK OFFICE
CERTIFICATE OF CORRECTION

PATENT NO.       : 7,655,970 B2                                        Page 1 of 1
APPLICATION NO.  : 11/359028
DATED            : February 2, 2010
INVENTOR(S)      : Ming-Chang Kuo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 582 days.

Signed and Sealed this

Thirtieth Day of November, 2010

David J. Kappos
*Director of the United States Patent and Trademark Office*